(12) United States Patent
Arya et al.

(10) Patent No.: US 10,169,836 B2
(45) Date of Patent: Jan. 1, 2019

(54) ENSURING FAIRNESS IN THE OPERATION OF THERMAL GRIDS

(71) Applicant: International Business Machines Corporation, Armonk, NY (US)

(72) Inventors: Vijay Arya, Bangalore (IN); Saptarshi Bhattacharya, Troy, NY (US); Vikas Chandan, Bengaluru (IN)

(73) Assignee: International Business Machines Corporation, Armonk, NY (US)

( * ) Notice: Subject to any disclaimer, the term of this patent is extended or adjusted under 35 U.S.C. 154(b) by 281 days.

(21) Appl. No.: 15/181,729

(22) Filed: Jun. 14, 2016

(65) Prior Publication Data
US 2017/0358038 A1    Dec. 14, 2017

(51) Int. Cl.
G06Q 50/06    (2012.01)
G05B 13/04    (2006.01)
G06F 17/50    (2006.01)

(52) U.S. Cl.
CPC .......... *G06Q 50/06* (2013.01); *G05B 13/041* (2013.01); *G06F 17/5009* (2013.01)

(58) Field of Classification Search
CPC .... G05B 13/041; G06F 17/5009; G06Q 50/06
USPC .................................................. 700/299, 300
See application file for complete search history.

(56) References Cited

U.S. PATENT DOCUMENTS

| | | | |
|---|---|---|---|
| 4,645,908 A * | 2/1987 | Jones | F24D 11/0214 392/340 |
| 5,706,191 A | 1/1998 | Bassett et al. | |
| 6,622,926 B1 | 9/2003 | Sartain et al. | |
| 8,109,289 B2 * | 2/2012 | Trnka | F24D 19/1015 137/487 |

(Continued)

FOREIGN PATENT DOCUMENTS

| | | |
|---|---|---|
| CN | 203131974 U | 8/2013 |
| DE | 202004017816 U1 | 3/2005 |

(Continued)

OTHER PUBLICATIONS

Poyry, The Potential Costs of District Heating Networks, http://www.poyry.co.uk/sites/www.poyry.uk/files/A_report_providing_a_technical_analysis_and_costing_of_DH_networks.pdf, Apr. 2009.

(Continued)

*Primary Examiner* — Chun Cao
(74) *Attorney, Agent, or Firm* — Ryan, Mason & Lewis, LLP

(57) ABSTRACT

Methods, systems, and computer program products for ensuring fairness in the operation of thermal grids are provided herein. A computer-implemented method includes generating one or more models derived from information pertaining to a heating and cooling network, wherein the heating and cooling network comprises multiple consumers; categorizing each of the multiple consumers into one of two groups based on (i) one or more objectives of the heating and cooling network, (ii) the one or more generated models, and (Continued)

(iii) one or more constraints; generating a signal to be sent to each of the consumers categorized within a first of the two groups, wherein the signal comprises a temperature set-point adjustment proposal; and outputting the signals to the consumers categorized within the first of the two groups.

17 Claims, 3 Drawing Sheets

(56) References Cited

U.S. PATENT DOCUMENTS

| | | | |
|---|---|---|---|
| 9,020,647 B2 | 4/2015 | Johnson et al. | |
| 2010/0063832 A1 | 3/2010 | Brown | |
| 2011/0000973 A1* | 1/2011 | Do | F24D 19/1015 237/8 A |
| 2011/0108233 A1* | 5/2011 | Wildig | F24D 11/0207 165/45 |
| 2012/0083920 A1 | 4/2012 | Ilic et al. | |
| 2012/0226388 A1* | 9/2012 | Evans | F24F 11/0012 700/299 |
| 2014/0074300 A1* | 3/2014 | Shilts | G05D 23/01 700/276 |
| 2014/0284391 A1* | 9/2014 | Schmidlin | F24D 3/14 236/1 C |
| 2016/0042377 A1 | 2/2016 | Ilic et al. | |

FOREIGN PATENT DOCUMENTS

| | | |
|---|---|---|
| DE | 202007010411 | 11/2007 |
| EP | 1496313 A1 | 1/2005 |
| FR | 2931226 A1 * | 11/2009 |
| WO | 1989011638 A1 | 11/1989 |
| WO | 2002025176 A1 | 3/2008 |
| WO | 2012074478 A1 | 6/2012 |
| WO | 2014059123 A1 | 4/2014 |
| WO | 2015161987 A1 | 4/2014 |
| WO | 2015104392 A2 | 7/2015 |

OTHER PUBLICATIONS

District Energy, What is District Energy? http://www.districtenergy.org/what-is-district-energy/, May 25, 2016.
"Energy efficiency improvements utilising mass flow control and a ring topology in a district heating network", T. Lajalehto, M. Kuosa et. al. Applied Thermal Engineering, vol. 69, 2014.
"Comfort-constrained distributed heat pump management", S. Parkinson, D. Wang, C. Crawford and N. Djilali, Energy Procedia 12 (2011).
"Economic model predictive control for building climate control in a smart grid," R. Halvgaard, N. K. Poulsen et.al., IEEE ISGT 2012.
Grosswindhager et al., "Predictive control of district heating network using fuzzy DMC," Intl. Conf. on Modelling, Identification and Control, Wuhan, China, 2012.
Pirouti et al., "Energy consumption and economic analyses of a district heating network," Energy, vol. 57, 2013.
Ikonen et al., "Short term optimization of district heating network supply temperatures," Intl. Energy Conf. (ENERGYCON), 2014.
Lauenburg et al., "Adaptive control of radiator systems for a lowest possible district heating return temperature," Energy and Buildings, vol. 72, 2014.

* cited by examiner

ENSURING FAIRNESS IN THE OPERATION OF THERMAL GRIDS

FIELD

The present application generally relates to information technology, and, more particularly, to energy distribution techniques.

BACKGROUND

A district heating and cooling (DHC) network and/or thermal grid includes a system wherein heating and cooling capabilities are procured centrally for an area, and hot and cold water can be provided to one or more buildings and/or structures for the area. Additionally, a DHC network can include heat exchangers and meters at user and/or customer premises.

A DHC utility generally aims for fairness in operation; that is, the DHC utility aims to serve all of its consumers satisfactorily by providing the desired indoor thermal comfort level (such as a set-point temperature) to all consumers. However, potentially unfair scenarios can result, for example, when supply is less than demand. Such scenarios can arise, for example, during and/or after extreme weather conditions, as well as during periods of significant demand.

SUMMARY

In one embodiment of the present invention, techniques for ensuring fairness in the operation of thermal grids are provided. An exemplary computer-implemented method can include steps of generating one or more models derived from information pertaining to a heating and cooling network, wherein the heating and cooling network comprises multiple consumers; categorizing each of the multiple consumers into one of two groups based on (i) one or more objectives of the heating and cooling network, (ii) the one or more generated models, and (iii) one or more constraints; generating a signal to be sent to each of the consumers categorized within a first of the two groups, wherein the signal comprises a temperature set-point adjustment proposal; and outputting the signals to the consumers categorized within the first of the two groups.

In another embodiment of the invention, an exemplary computer-implemented method can include generating one or more models based on (i) information pertaining to a heating and cooling network and (ii) one or more network constraints, wherein the heating and cooling network comprises multiple consumers, determining one or more objectives of the heating and cooling network, and categorizing each of the multiple consumers into one of two groups based on (i) the one or more determined objectives and (ii) the one or more generated models, wherein the two groups comprise (a) a group of energy distribution beneficiaries and (b) a group of energy distribution facilitators. Such a method can also include generating one or more signals to be sent to each of the consumers categorized within the group of energy distribution facilitators, wherein the signal comprises a temperature set-point adjustment proposal, and outputting the one or more signals to the consumers categorized within the group of energy distribution facilitators.

Another embodiment of the invention or elements thereof can be implemented in the form of an article of manufacture tangibly embodying computer readable instructions which, when implemented, cause a computer to carry out a plurality of method steps, as described herein. Furthermore, another embodiment of the invention or elements thereof can be implemented in the form of an apparatus including a memory and at least one processor that is coupled to the memory and configured to perform noted method steps. Yet further, another embodiment of the invention or elements thereof can be implemented in the form of means for carrying out the method steps described herein, or elements thereof; the means can include hardware module(s) or a combination of hardware and software modules, wherein the software modules are stored in a tangible computer-readable storage medium (or multiple such media).

These and other objects, features and advantages of the present invention will become apparent from the following detailed description of illustrative embodiments thereof, which is to be read in connection with the accompanying drawings.

DETAILED DESCRIPTION

Figure 1:
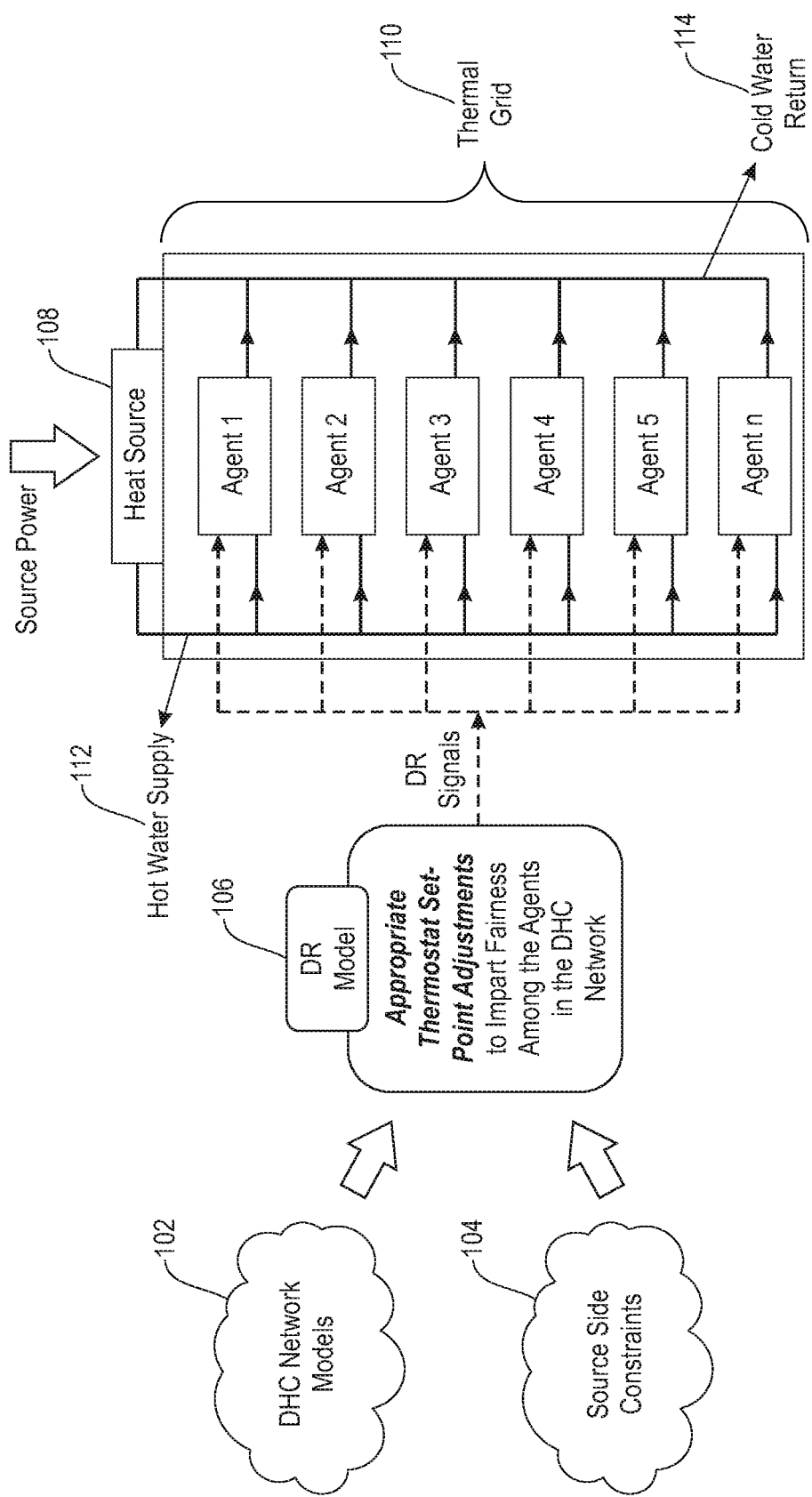
FIG. 1 is a diagram illustrating system architecture, according to an exemplary embodiment of the invention.

As described herein, an embodiment of the present invention includes systems and methodologies for ensuring fairness in the operation of thermal grids. At least one embodiment of the invention can include achieving demand response (DR) objectives in the context of DHC networks such as, for example, minimizing peak loading, ensuring load curtailment in constrained environment, and ensuring fairness among DR agents.

Accordingly, one or more embodiments of the invention include managing distribution of energy for providing heating and/or cooling capabilities to consumers in a DHC network. Such an embodiment can include classifying consumers within the network as either beneficiaries or facilitators, wherein facilitators adaptively modify their set-points based on the required thermal comfort objective, thereby assisting a DHC controller to satisfy demands of beneficiaries. Such a characterization can include a function of one or more factors such as, for example, ambient temperature, supply and demand scenario in the network, insulation properties of consumers' premises, etc. In an example embodiment of the invention, such a characterization can include identifying consumers with insulation properties that are greater than a pre-determined threshold and/or consumers that are located within a predetermined distance from the heat source as "facilitators," and the remaining consumers as "beneficiaries."

The classification of consumers can be carried out, for example, via dynamic selection across a temporal scale (that is, classification can also be time dependent). An example embodiment of the invention can include implementing and/or utilizing a look-up table-based approach wherein the network manager (central utility) uses a look-up table to map one or more demographic parameters of a consumer to the consumer's potential for DR facilitation (or the consumer's potential for being a DR beneficiary candidate). Another example embodiment of the invention can include implementing and/or utilizing a look-ahead optimization-based approach wherein estimated thermal values are employed for classification. By way of example, such thermal values can be estimated from data using time series regression analysis techniques. Some of these values (heat transfer coefficients of heat exchangers, etc.) can also be obtained from the specification sheets for the components.

Additionally, at least one embodiment of the invention can include ensuring fairness among the network consumers with respect to thermal comfort via redistribution of thermal comfort from DR facilitators to DR beneficiaries. Such an embodiment can include enabling and/or permitting real-time adjustments in set-point changes through a user interface. For example, such an embodiment includes implementing a two loop DR mechanism that includes (i) an outer loop that solves a DR optimization problem to provide a set of optimal set-point adjustments, and (ii) an inner loop that includes a user interface which can be used to leverage flexibility in accepting the scheduled set-points as is or within some acceptable or pre-determined bounds.

One or more embodiments of the invention include carrying out DR facilitation independent of the network topology. Additionally, at least one embodiment of the invention can include facilitating and/or enabling the DR for a multitude of network objectives. Such objectives can include, for example, the overall increase of social utility, the reduction in the variance of thermal discomfort across network agents, and ensuring an optimal trade-off in separating a percentage of a budget for availing fuel and a percentage of the budget allocated for providing DR incentives. By way of example, an objective of a DR program can include reducing the cost of operations for the utility, which can translate into reduced budget for the fuel. However, DR can require allocation of incentives to consumers, resulting in an expense for the utility. The trade-off in this context is between the savings as a result of DR and the cost incurred via incentives provided for DR.

FIG. 1 is a diagram illustrating system architecture, according to an embodiment of the invention. By way of illustration, FIG. 1 depicts a DR module 106, which receives input from a collection of one or more DHC network models 102 and a collection of one or more source-side constraints 104. Such constraints can include, for example, a limitation on the heat that can be provided to the network, as well as a limitation on the rate at which the supply water temperature to the network can be changed. Based on these inputs, the DR module 106 (centrally) generates one or more thermostat set-point adjustments to impart fairness among the agents/consumers in a given DHC network. The DR module 106 subsequently outputs DR signals to multiple agents within the network and/or thermal grid 110, which includes a heat source 108 (which receives source power), a hot water supply 112 and a cold water return 114. By way of example, the DR module 106 can output different DR signals (for example, different set-point adjustment proposals) to different agents within the network 110.

Accordingly, as depicted in FIG. 1, at least one embodiment of the invention includes developing DHC network and consumer models, as well as identifying and quantifying one or more network objectives (such as ensuring fairness across consumers, for example). Such consumer models can be developed, for example, using physical principles of thermodynamics and heat transfer. The parameters which appear in such models (such as thermal resistance, capacitance, and heat transfer coefficients) can be learnt from sensor data using time series regression techniques.

Additionally, such an embodiment also includes partitioning the consumers into two categories, (i) DR beneficiaries and (ii) DR facilitators, wherein such partitioning is carried out using the developed DHC network and consumer models and the identified/quantified network objectives. An optimization framework, in accordance with one or more embodiments of the invention, can include implementing a mixed integer approach, wherein binary variables are used for indicating the selection status of a consumer for DR. The optimization outputs the optimal values of these indicator variables, which results in the categorization of beneficiaries and facilitators.

Further, an embodiment of the invention such as depicted in FIG. 1 can include generating DR signals to be sent to the partitioned group of DR facilitators. Such signals can include, for example, proposed modifications to set-point temperatures for one or more of the consumers. Additionally, as detailed herein, one or more embodiments of the invention can also include providing and/or implementing a user interface for real-time adjustment of set-point temperatures. In at least one embodiment of the invention, the user interface is located and/or implemented at the consumer site (such that the consumer can indicate preferences).

In one or more embodiments of the invention, a DR module, such as depicted as component 106 in FIG. 1, can utilize and/or leverage a variety of information obtained from DHC network models (such as component 102 depicted in FIG. 1) and/or source-side constraints (such as component 104 depicted in FIG. 1). Such information can include, for example, an indoor zone temperature for a specific consumer/building (within the network), an ambient temperature profile (for the geographic area surrounding the DHC network), and the thermal resistance and capacitance of a specific consumer/building (within the network). Such information can also include, for example, the available heat for district heating (and/or related constraints), the mass flow rate of fluid in a consumer/building side, the mass flow rate of fluid in the utility side, as well as the plate heat exchanger effectiveness of the consumers/buildings. Further, such information can additionally include, for example, supply and return temperatures for a specific consumer/building in the mains side as well as for a specific consumer/building in the building side. As referred to herein, the mains side corresponds to the distribution network leading from the central heat sources up to the consumers, and the building side corresponds to the distribution network within a building which extracts heat from the mains side (through heat exchangers) to provide the heating requirements of the consumers within the building.

Information utilized and/or leveraged by a DR module can also include, for example, valve controller parameters of the buildings (within the network), heat exchanger characteristics (such as, for example, heat transfer coefficient), and the specific heat capacity of water (4.184 Joules per kilogram per degrees Celsius (J/kg/degC)). Such information can also include, for example, loss adjusted effective return temperatures of the DHC network, loss adjusted return temperatures for a specific consumer/building (within the network), supply side temperature of the DHC network, and thermal loss (in degree C.) for a specific consumer/building (within the network). Further, such information can additionally include, for example, the difference between the supply temperature of the mains side and the building side, a binary variable (0 or 1) which denotes if a specific consumer/building (within the network) is selected or not for demand response, and the reduction in a temperature set point for a specific consumer/building (within the network).

Figure 2:
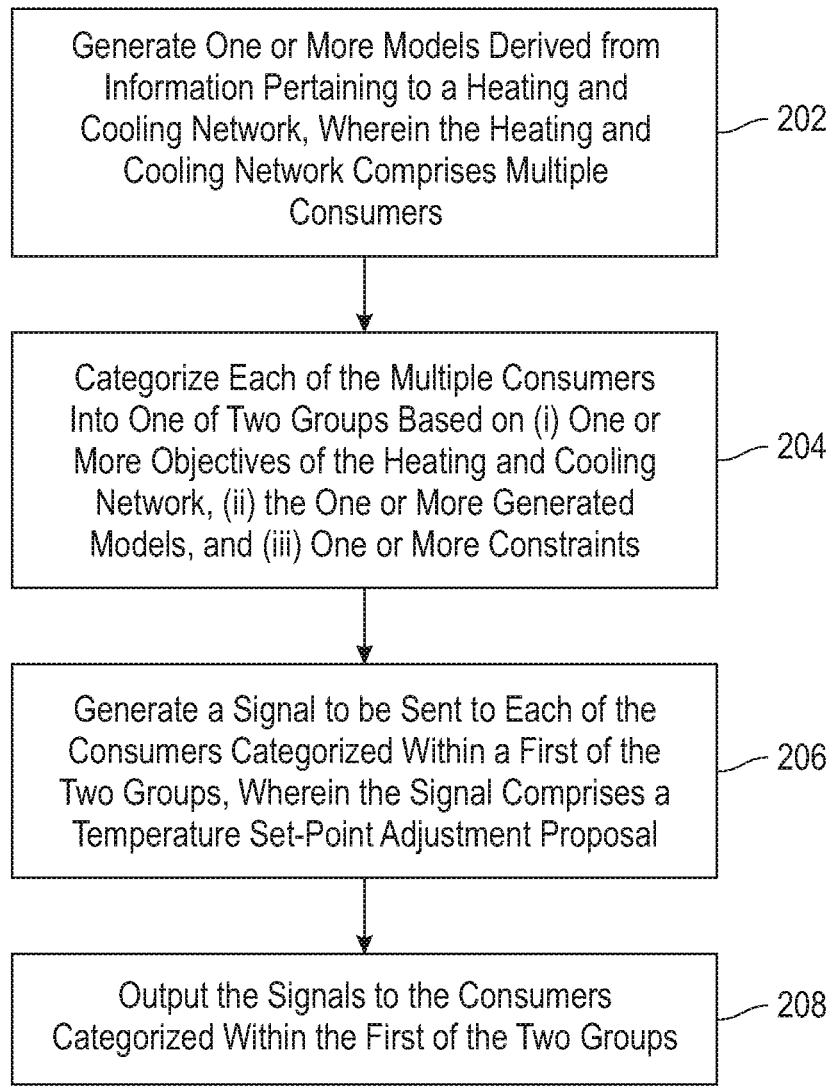
FIG. 2 is a flow diagram illustrating techniques according to an embodiment of the invention.

FIG. 2 is a flow diagram illustrating techniques according to an embodiment of the present invention. Step 202 includes generating one or more models derived from information pertaining to a heating and cooling network, wherein the heating and cooling network comprises multiple consumers. In one or more embodiments of the invention, the multiple consumers can correspond to multiple buildings.

Step 204 includes categorizing each of the multiple consumers into one of two groups based on (i) one or more objectives of the heating and cooling network, (ii) the one or more generated models, and (iii) one or more constraints. Such constraints can include, for example, constraints on the mains side. The two groups can include (i) a group of energy distribution beneficiaries and (ii) a group of energy distribution facilitators, wherein the group of energy facilitators adaptively modify temperature set-points corresponding thereto, thereby assisting in satisfaction of one or more thermal demands of the group of energy distribution beneficiaries. Also, the one or more objectives can include an overall increase of utility arising from the heating and cooling network, and a reduction in the variance of thermal discomfort across the multiple consumers. Additionally, at least one embodiment of the invention can include quantifying each of the one or more objectives.

In one or more embodiments of the invention, categorizing can include implementing a look-up table-based approach, which can include using a look-up table to map one or more demographic parameters of a given consumer to the given consumer's potential for energy distribution facilitation and/or using a look-up table to map one or more demographic parameters of a given consumer to the given consumer's potential candidacy for being an energy distribution beneficiary. Also, in one or more embodiments of the invention, categorizing can include implementing a look-ahead optimization-based approach wherein estimated thermal values are employed for said categorization.

Step 206 includes generating a signal to be sent to each of the consumers categorized within a first of the two groups, wherein the signal comprises a temperature set-point adjustment proposal. Step 208 includes outputting the signals to the consumers categorized within the first of the two groups.

The techniques depicted in FIG. 2 can additionally include providing a user interface capable of carrying out a real-time adjustment of a temperature set-point for one or more of the consumers within the first of the two groups. In one or more embodiments of the invention, the real-time adjustment of the temperature set-point is within pre-determined bounds.

Also, an additional embodiment of the invention includes generating one or more models based on (i) information pertaining to a heating and cooling network and (ii) one or more network constraints, wherein the heating and cooling network comprises multiple consumers, determining one or more objectives of the heating and cooling network, and categorizing each of the multiple consumers into one of two groups based on (i) the one or more determined objectives and (ii) the one or more generated models, wherein the two groups comprise (a) a group of energy distribution beneficiaries and (b) a group of energy distribution facilitators. Such an embodiment can also include generating one or more signals to be sent to each of the consumers categorized within the group of energy distribution facilitators, wherein the signal comprises a temperature set-point adjustment proposal, and outputting the one or more signals to the consumers categorized within the group of energy distribution facilitators.

The techniques depicted in FIG. 2 can also, as described herein, include providing a system, wherein the system includes distinct software modules, each of the distinct software modules being embodied on a tangible computer-readable recordable storage medium. All of the modules (or any subset thereof) can be on the same medium, or each can be on a different medium, for example. The modules can include any or all of the components shown in the figures and/or described herein. In an embodiment of the invention, the modules can run, for example, on a hardware processor. The method steps can then be carried out using the distinct software modules of the system, as described above, executing on a hardware processor. Further, a computer program product can include a tangible computer-readable recordable storage medium with code adapted to be executed to carry out at least one method step described herein, including the provision of the system with the distinct software modules.

Additionally, the techniques depicted in FIG. 2 can be implemented via a computer program product that can include computer useable program code that is stored in a computer readable storage medium in a data processing system, and wherein the computer useable program code was downloaded over a network from a remote data processing system. Also, in an embodiment of the invention, the computer program product can include computer useable program code that is stored in a computer readable storage medium in a server data processing system, and wherein the computer useable program code is downloaded over a network to a remote data processing system for use in a computer readable storage medium with the remote system.

An embodiment of the invention or elements thereof can be implemented in the form of an apparatus including a memory and at least one processor that is coupled to the memory and configured to perform exemplary method steps.

Figure 3:
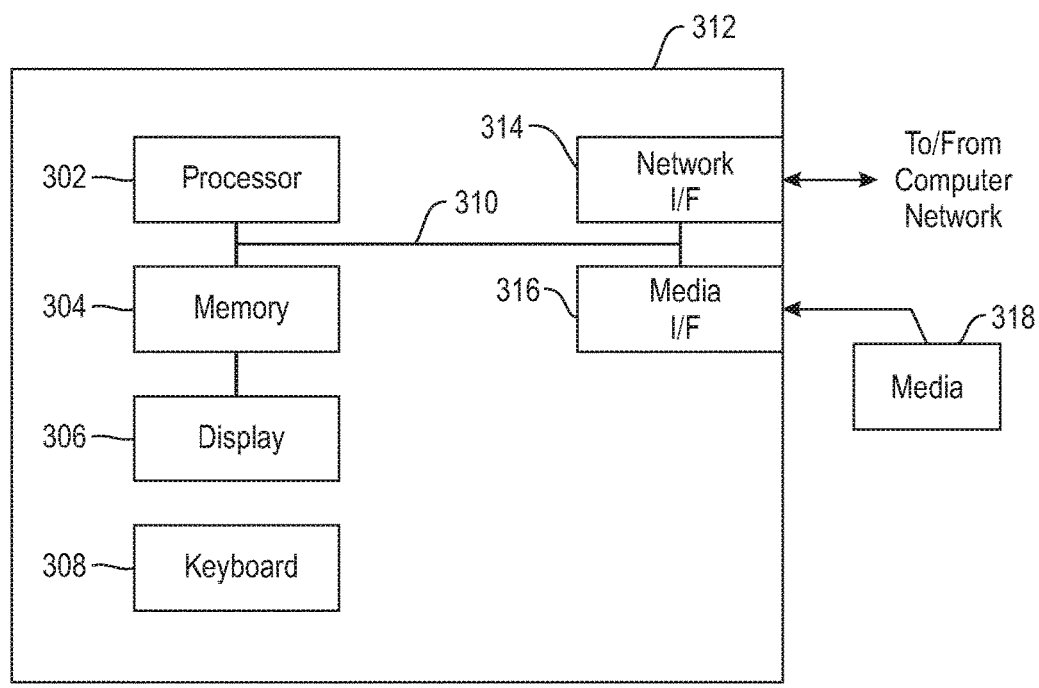
FIG. 3 is a system diagram of an exemplary computer system on which at least one embodiment of the invention can be implemented.

Additionally, an embodiment of the present invention can make use of software running on a computer or workstation. With reference to FIG. 3, such an implementation might employ, for example, a processor 302, a memory 304, and an input/output interface formed, for example, by a display 306 and a keyboard 308. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, a mechanism for inputting data to the processing unit (for example, mouse), and a mechanism for providing results associated with the processing unit (for example, printer). The processor 302, memory 304, and input/output interface such as display 306 and keyboard 308 can be interconnected, for example, via bus 310 as part of a data processing unit 312. Suitable interconnections, for example via bus 310, can also be provided to a network interface 314, such as a network card, which can be provided to interface with a computer network, and to a media interface 316, such as a diskette or CD-ROM drive, which can be provided to interface with media 318.

Accordingly, computer software including instructions or code for performing the methodologies of the invention, as described herein, may be stored in associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 302 coupled directly or indirectly to memory elements 304 through a system bus 310. The memory elements can include local memory employed during actual implementation of the program code, bulk storage, and cache memories which provide temporary storage of at least some program code in order to reduce the number of times code must be retrieved from bulk storage during implementation.

Input/output or I/O devices (including, but not limited to, keyboards 308, displays 306, pointing devices, and the like) can be coupled to the system either directly (such as via bus 310) or through intervening I/O controllers (omitted for clarity).

Network adapters such as network interface 314 may also be coupled to the system to enable the data processing system to become coupled to other data processing systems or remote printers or storage devices through intervening private or public networks. Modems, cable modems and Ethernet cards are just a few of the currently available types of network adapters.

As used herein, including the claims, a "server" includes a physical data processing system (for example, system 312 as shown in FIG. 3) running a server program. It will be understood that such a physical server may or may not include a display and keyboard.

The present invention may be a system, a method, and/or a computer program product at any possible technical detail level of integration. The computer program product may include a computer readable storage medium (or media) having computer readable program instructions thereon for causing a processor to carry out embodiments of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform embodiments of the present invention.

Embodiments of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It should be noted that any of the methods described herein can include an additional step of providing a system comprising distinct software modules embodied on a computer readable storage medium; the modules can include, for example, any or all of the components detailed herein. The method steps can then be carried out using the distinct software modules and/or sub-modules of the system, as described above, executing on a hardware processor 302. Further, a computer program product can include a computer-readable storage medium with code adapted to be implemented to carry out at least one method step described herein, including the provision of the system with the distinct software modules.

In any case, it should be understood that the components illustrated herein may be implemented in various forms of hardware, software, or combinations thereof, for example, application specific integrated circuit(s) (ASICS), functional circuitry, an appropriately programmed digital computer with associated memory, and the like. Given the teachings of the invention provided herein, one of ordinary skill in the related art will be able to contemplate other implementations of the components of the invention.

Additionally, it is understood in advance that implementation of the teachings recited herein are not limited to a particular computing environment. Rather, embodiments of the present invention are capable of being implemented in conjunction with any other type of computing environment now known or later developed.

By way of example, cloud computing is a model of service delivery for enabling convenient, on-demand network access to a shared pool of configurable computing resources (for example, networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (for example, country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (for example, storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (for example, web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (for example, host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (for example, mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (for example, cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of another feature, step, operation, element, component, and/or group thereof.

At least one embodiment of the present invention may provide a beneficial effect such as, for example, categorizing consumers as beneficiaries and/or facilitators for facilitating fair and/or even distribution of power to the consumers in a DHC network.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method, comprising:
    generating one or more models derived from information pertaining to a heating and cooling network, wherein the heating and cooling network comprises multiple consumers;
    categorizing each of the multiple consumers into one of two groups based on (i) one or more objectives of the heating and cooling network, (ii) the one or more generated models, and (iii) one or more constraints, wherein the two groups comprise a group of energy distribution beneficiaries and a group of energy distribution facilitators, and wherein the group of energy facilitators adaptively modify temperature set-points corresponding thereto, thereby assisting in satisfaction of one or more thermal demands of the group of energy distribution beneficiaries;
    generating a signal to be sent to each of the consumers categorized within the group of energy facilitators, wherein the signal comprises a temperature set-point adjustment proposal; and
    outputting the signals to the consumers categorized within the first of the two groups;
    wherein the steps are carried out by at least one computing device.

2. The computer-implemented method of claim 1, comprising:
    providing a user interface capable of carrying out a real-time adjustment of a temperature set-point for one or more of the consumers within the group of energy facilitators.

3. The computer-implemented method of claim 2, wherein the real-time adjustment of the temperature set-point is within pre-determined bounds.

4. The computer-implemented method of claim 1, wherein the multiple consumers correspond to multiple buildings.

5. The computer-implemented method of claim 1, wherein the one or more objectives comprise an overall increase of utility arising from the heating and cooling network.

6. The computer-implemented method of claim 1, wherein the one or more objectives comprise a reduction in the variance of thermal discomfort across the multiple consumers.

7. The computer-implemented method of claim 1, wherein said categorizing comprises implementing a look-up table-based approach.

8. The computer-implemented method of claim 7, wherein said implementing a look-up table-based approach comprises using a look-up table to map one or more demographic parameters of a given consumer to the given consumer's potential for energy distribution facilitation.

9. The computer-implemented method of claim 7, wherein said implementing a look-up table-based approach comprises using a look-up table to map one or more demographic parameters of a given consumer to the given consumer's potential candidacy for being an energy distribution beneficiary.

10. The computer-implemented method of claim 1, wherein said categorizing comprises implementing a look-ahead optimization-based approach wherein estimated thermal values are employed for said categorization.

11. The computer-implemented method of claim 1, comprising:
    quantifying each of the one or more objectives.

12. A computer program product comprising a computer readable storage medium having program instructions embodied therewith, the program instructions executable by a device to cause the device to:
    generate one or more models derived from information pertaining to a heating and cooling network, wherein the heating and cooling network comprises multiple consumers;
    categorize each of the multiple consumers into one of two groups based on (i) one or more objectives of the heating and cooling network, (ii) the one or more generated models, and (iii) one or more constraints, wherein the two groups comprise a group of energy distribution beneficiaries and a group of energy distribution facilitators, and wherein the group of energy facilitators adaptively modify temperature set-points corresponding thereto, thereby assisting in satisfaction of one or more thermal demands of the group of energy distribution beneficiaries;
    generate a signal to be sent to each of the consumers categorized within the group of energy facilitators, wherein the signal comprises a temperature set-point adjustment proposal; and
    output the signals to the consumers categorized within the first of the two groups.

13. The computer program product of claim 12, wherein the program instructions executable by a computing device further cause the computing device to:

provide a user interface capable of carrying out a real-time adjustment of a temperature set-point for one or more of the consumers within the group of energy facilitators.

14. The computer program product of claim 12, wherein said categorizing comprises implementing a look-up table-based approach.

15. The computer program product of claim 12, wherein said categorizing comprises implementing a look-ahead optimization-based approach wherein estimated thermal values are employed for said categorization.

16. A system comprising:

a memory; and at least one processor coupled to the memory and configured for:

generating one or more models derived from information pertaining to a heating and cooling network, wherein the heating and cooling network comprises multiple consumers;

categorizing each of the multiple consumers into one of two groups based on (i) one or more objectives of the heating and cooling network, (ii) the one or more generated models, and (iii) one or more constraints, wherein the two groups comprise a group of energy distribution beneficiaries and a group of energy distribution facilitators, and wherein the group of energy facilitators adaptively modify temperature set-points corresponding thereto, thereby assisting in satisfaction of one or more thermal demands of the group of energy distribution beneficiaries;

generating a signal to be sent to each of the consumers categorized within the group of energy facilitators, wherein the signal comprises a temperature set-point adjustment proposal; and outputting the signals to the consumers categorized within the first of the two groups.

17. A computer-implemented method, comprising:

generating one or more models based on (i) information pertaining to a heating and cooling network and (ii) one or more network constraints, wherein the heating and cooling network comprises multiple consumers;

determining one or more objectives of the heating and cooling network;

categorizing each of the multiple consumers into one of two groups based on (i) the one or more determined objectives and (ii) the one or more generated models, wherein the two groups comprise (a) a group of energy distribution beneficiaries and (b) a group of energy distribution facilitators, wherein the group of energy facilitators adaptively modify temperature set-points corresponding thereto, thereby assisting in satisfaction of one or more thermal demands of the group of energy distribution beneficiaries;

generating one or more signals to be sent to each of the consumers categorized within the group of energy distribution facilitators, wherein the signal comprises a temperature set-point adjustment proposal; and outputting the one or more signals to the consumers categorized within the group of energy distribution facilitators;

wherein the steps are carried out by at least one computing device.

* * * * *